United States Patent
Habu

(10) Patent No.: US 9,526,161 B2
(45) Date of Patent: Dec. 20, 2016

(54) HIGH-FREQUENCY POWER SUPPLY DEVICE

(71) Applicant: SHIMADZU CORPORATION, Kyoto-shi, Kyoto (JP)

(72) Inventor: Toshiya Habu, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 14/825,301

(22) Filed: Aug. 13, 2015

(65) Prior Publication Data
US 2016/0066404 A1 Mar. 3, 2016

(30) Foreign Application Priority Data

Aug. 29, 2014 (JP) .................. 2014-175349

(51) Int. Cl.
| | |
|---|---|
| H05H 1/46 | (2006.01) |
| H01J 37/32 | (2006.01) |
| G01J 3/02 | (2006.01) |
| H05H 1/36 | (2006.01) |

(52) U.S. Cl.
CPC .................. *H05H 1/46* (2013.01); *G01J 3/027* (2013.01); *H01J 37/321* (2013.01); *H01J 37/32174* (2013.01); *H05H 1/36* (2013.01); H05H 2001/4652 (2013.01); H05H 2001/4682 (2013.01)

(58) Field of Classification Search
CPC ............ H05H 1/46; H05H 1/36; H01J 37/321; H01J 37/32174; G01J 3/027
See application file for complete search history.

(56) References Cited

U.S. PATENT DOCUMENTS

| | | | |
|---|---|---|---|
| 6,329,757 B1 | 12/2001 | Morrisroe et al. | |
| 7,100,532 B2 * | 9/2006 | Pribyl ............... | H01J 37/32082 118/723 AN |
| 7,166,816 B1 * | 1/2007 | Chen ....................... | H05H 1/46 118/723 R |
| 8,575,843 B2 * | 11/2013 | Moore ................. | A61B 18/042 315/111.21 |
| 8,994,270 B2 * | 3/2015 | Koo .................. | H01J 37/32366 315/111.11 |

(Continued)

FOREIGN PATENT DOCUMENTS

| | | |
|---|---|---|
| EP | 0 568 920 A1 | 11/1993 |
| JP | 06-20793 A | 1/1994 |

(Continued)

*Primary Examiner* — Jue Zhang
(74) *Attorney, Agent, or Firm* — Sughrue Mion, PLLC

(57) ABSTRACT

A transformer is formed into a substantially U shape. The length of the transformer may thus be secured, and also the length of pattern wiring between an input terminal and an output terminal of a secondary coil of the transformer and the control terminals of a semiconductor device may be reduced. Moreover, the primary coil and the secondary coil of the transformer are arranged in parallel. The coupling coefficient between the primary coil and the secondary coil is thereby increased. An LC resonant circuit, not including the induction coil, and a switching circuit and the transformer are accommodated inside a housing. A water-cooling radiator is provided inside the housing, and also air inside the housing is circulated by a cooling fan while being guided to the radiator.

6 Claims, 5 Drawing Sheets

(56) References Cited

U.S. PATENT DOCUMENTS

| | | | |
|---|---|---|---|
| 9,272,359 B2* | 3/2016 | Koo | A61C 19/00 |
| 9,288,886 B2* | 3/2016 | Koo | A61B 18/042 |
| 2006/0017388 A1* | 1/2006 | Stevenson | H01J 37/321 |
| | | | 315/111.51 |
| 2008/0083701 A1* | 4/2008 | Shao | H01J 37/32862 |
| | | | 216/58 |
| 2009/0129131 A1 | 5/2009 | Hosemans | |

FOREIGN PATENT DOCUMENTS

| | | |
|---|---|---|
| JP | 10-214698 A | 8/1998 |
| JP | 2009-537829 A | 10/2009 |

* cited by examiner

HIGH-FREQUENCY POWER SUPPLY DEVICE

BACKGROUND OF THE INVENTION

Field of the Invention

The present invention relates to a high-frequency power supply device for generating plasma by supplying high-frequency power to an induction coil included in a resonant circuit from a DC power supply via a switching circuit.

Description of the Related Art

For example, an analysis device such as an inductively coupled plasma (ICP) emission spectrometer has a configuration of generating plasma at a plasma torch by supplying high-frequency power to an induction coil included in a resonant circuit (for example, see JP-A-10-214698, JP-W-2009-537829, and JP-A-6-20793). A high-frequency electromagnetic field is generated by the high-frequency power supplied to the induction coil, and an induced current flows by charged particles in plasma being accelerated, and plasma is thereby heated.

In the case of such a configuration, the impedance (resistance component and reactance component) of the induction coil is changed in accordance with generation of plasma. That is, the effective inductance of the induction coil is reduced due to reduction, caused by the induced current, in the magnetic field formed by the induction coil. Also, due to loss of energy caused by heating of plasma, a resistance component is caused in the induction coil. Furthermore, the impedance of the induction coil also changes due to the state of plasma changing according to the state of a plasma-generating gas or an analysis sample, the shape of the plasma torch, the plasma input power or the like.

At the time of inputting power to plasma, the resonant circuit composed of the induction coil and a capacitor is driven at a specific oscillation frequency. The output impedance of a normal high-frequency power supply is set to 50 $\Omega$, and thus an impedance conversion circuit is arranged between the high-frequency power supply and the induction coil, and control is performed in such a way that the impedance seen from the high-frequency power supply side is 50 $\Omega$ at all times. In this case, to eliminate the reflected power from the impedance conversion circuit, a method is generally adopted of driving a vacuum variable capacitor in the impedance conversion circuit by a motor or the like and adjusting the capacitance, for example.

In the case of such a configuration, the plasma input power is equal to the output power of the high-frequency power supply, and thus by calibrating the output power of the high-frequency power supply in advance by using a power meter with 50 $\Omega$, for example, the plasma input power may be accurately controlled. However, with such a configuration, to maintain the optimum state at all times by controlling the impedance conversion circuit, a complex control mechanism and expensive parts have to be used. Accordingly, these days, a method of changing the frequency according to a change in a load impedance (a so-called free running method) without using expensive parts such as a vacuum variable capacitor is being widely used.

JP-A-10-214698, JP-W-2009-537829, and JP-A-6-20793 disclose techniques related to a self-oscillating method as the simplest circuit configuration of the free-running type. These techniques do not limit the output impedance of the high-frequency power supply to 50 $\Omega$, and adopt a method of directly driving the resonant circuit composed of the induction coil and the capacitor. By adopting a self-oscillating method where the frequency automatically changes according to a change in the load impedance, as described above, a frequency control circuit, an impedance conversion circuit and the like may be omitted, and a simpler high-frequency power supply device may be provided.

SUMMARY OF THE INVENTION

JP-A-6-20793 proposes a configuration where a vacuum tube is used as an amplifier element. However, an amplifier element using a vacuum tube is not only poor in efficiency, but also requires periodic replacement due to short life and due to a change over time in electrical characteristics being great.

Also, the configurations of JP-A-10-214698 and JP-W-2009-537829 include problems as follows. First, with a conventional high-frequency power supply device of a self-oscillating method including a switching circuit that uses a semiconductor device such as a MOSFET (Metal Oxide Semiconductor Field-Effect Transistor), the coupling coefficient between a primary coil and a secondary coil of a transformer for applying a feedback voltage to control terminals of the semiconductor device is low, and thus the amplitude of the feedback voltage, for example, the voltage between the gate and the source of the MOSFET, is small. Accordingly, a configuration is adopted where a DC bias voltage is supplied to the control terminals of the semiconductor device, for example, between the gate terminal and the source terminal of the MOSFET.

However, variation or fluctuation in the electrical characteristics of a semiconductor device, such as the amplification factor and an input threshold voltage, is great, and it is difficult to control the DC bias voltage to be an optimum value at all times. Also, if the DC bias voltage becomes too high, a large current flows due to the semiconductor device being placed in a complete on state, and the semiconductor device may be broken.

Furthermore, in the case where the switching circuit is of a half-bridge configuration or a full-bridge configuration, the DC bias voltage has to be supplied to all the semiconductor devices. Moreover, the semiconductor device on the high side has to be a DC bias circuit not connected to ground potential, and there is a problem that the cost is increased.

On the other hand, with a high-frequency power supply device for plasma generation, high-frequency power of several hundred watts to several kilo-watts has to be supplied to an induction coil, and the temperature of a circuit section or the like for self-oscillation becomes high, and thus a heat generation section including the circuit section has to be cooled. Thus, a configuration is generally adopted where air outside the high-frequency power supply device is blown against the heat generation section by a cooling fan or the like and the air is exhausted outside to thereby cool the heat generation section.

With a high-frequency power supply device of a self-oscillating method, the main body of the device has to be arranged near the induction coil. However, with a device that possibly uses an acid sample, such as an inductively coupled plasma (ICP) emission spectrometer, the periphery of a plasma generation section where the induction coil is arranged is acidic atmosphere. Accordingly, when a configuration where the air outside the high-frequency power supply device is blown against the heat generation section is adopted, reliability may possibly be reduced due to parts inside the device being polluted by the acidic atmosphere outside the device, dusts and the like.

The present invention has been made in view of the above circumstances, and has its aim to provide a highly reliable and highly efficient high-frequency power supply device with a simple circuit configuration which is capable of preventing pollution of parts inside the device by air outside the device, where there is no need to supply a DC bias voltage to control terminals of a semiconductor device according to an increase in a feedback voltage.

A high-frequency power supply device of the present invention is a high-frequency power supply device of a self-oscillating method provided with a DC power supply, an LC resonant circuit, a switching circuit and a transformer. The LC resonant circuit includes an induction coil for plasma generation, and a capacitor. The switching circuit includes a semiconductor device that switches DC power supplied from the DC power supply, and provides high-frequency power to the LC resonant circuit. The transformer includes a primary coil that is included in the LC resonant circuit, and a secondary coil that is connected to a control terminal of the semiconductor device to turn on or off the semiconductor device. The transformer is formed into a substantially U shape. The primary coil and the secondary coil of the transformer are arranged in parallel. A capacitor is connected to the control terminal of the semiconductor device, in parallel with the secondary coil.

According to such a configuration, by forming the transformer into a substantially U shape, a length long enough to generate a sufficient feedback voltage may be secured, and also the length of the wiring between an input terminal and an output terminal of the secondary coil of the transformer and the control terminals of the semiconductor device maybe reduced and attenuation of the feedback voltage by pattern inductance maybe suppressed. Also, by arranging the primary coil and the secondary coil of the transformer in parallel with each other, the coupling coefficient between the primary coil and the secondary coil is increased. The feedback voltage may be increased by these structural refinements, and the need to supply a DC bias voltage to the control terminals of the semiconductor device may be eliminated.

Moreover, by connecting the capacitor in parallel with the secondary coil to the control terminals of the semiconductor device, the influence of variation or fluctuation of the gate-source capacitance of the MOSFET may be made small. Also, since the voltage at the control terminals of the semiconductor device having a non-linear gate charge characteristic is made to change more linearly, ringing in the switching waveform due to load inductance is suppressed, high power supply efficiency may be realized.

The transformer may be formed into a co-axial structure including the primary coil and the secondary coil on a same axis. In this case, the transformer may be configured by a semi-rigid co-axial cable.

According to such a configuration, the coupling coefficient between the primary coil and the secondary coil may be increased by arranging the two on the same axis. Also, in a case where the transformer is configured by using a semi-rigid co-axial cable not including an outer sheath, high heat dissipation efficiency may be realized without a task of removing the outer sheath.

The transformer may be in contact with an insulating radiator.

According to such a configuration, since heat generated at the transformer is dissipated via the radiator, the heat dissipation efficiency may be further increased. Especially, by using the insulating radiator, even if the transformer does not include an outer sheath, the feedback voltage may be prevented from being reduced due to the current of the primary coil flowing to the radiator and the interlinkage magnetic flux to the secondary coil being reduced.

The semiconductor device may be a MOSFET.

According to such a structure, the gate amplitude of the MOSFET may be made great, and there is no need to supply a DC bias voltage to a gate electrode of the MOSFET.

A high-frequency power supply device of the present invention is a high-frequency power supply device of a self-oscillating method provided with a DC power supply, an LC resonant circuit, a switching circuit, a transformer, a housing, a radiator and a cooling fan. The LC resonant circuit includes an induction coil for plasma generation, and a capacitor. The switching circuit includes a semiconductor device that switches DC power supplied from the DC power supply, and provides high-frequency power to the LC resonant circuit. The transformer includes a primary coil that is included in the LC resonant circuit, and a secondary coil that is connected to a control terminal of the semiconductor device to turn on or off the semiconductor device. The housing accommodates the LC resonant circuit, not including the induction coil, and the switching circuit and the transformer. The radiator is a water-cooling radiator, and provided inside the housing for cooling parts inside the housing. The cooling fan is provided inside the housing, and causes air inside the housing to circulate while guiding the air to the radiator.

According to such a configuration, parts such as the LC resonant circuit, not including the induction coil, and the switching circuit and the transformer are accommodated inside the housing, and by causing the air inside the housing to circulate by the cooling fan, air outside the device can be prevented from easily flowing into the device. Thus, pollution of the parts inside the device by the air outside the device may be prevented.

Also, since the parts inside the housing are cooled by the water-cooling radiator, and the air that is circulated inside the housing by the cooling fan is circulated while being cooled by the water-cooling radiator, high cooling efficiency may be realized. Accordingly, the parts inside the device may be desirably cooled even with a configuration where air outside the device does not easily flow into the device.

According to the present invention, the wiring between the input terminal and the output terminal of the secondary coil of the transformer and the control terminals of the semiconductor device may be made short, and the coupling coefficient between the primary coil and the secondary coil is increased, and thus the feedback voltage may be increased. Also, according to the present invention, air outside the device can be prevented from easily flowing into the device, and pollution of the parts inside the device by the air outside the device may be prevented.

DETAILED DESCRIPTION OF THE PREFERRED EMBODIMENTS

Figure 1:
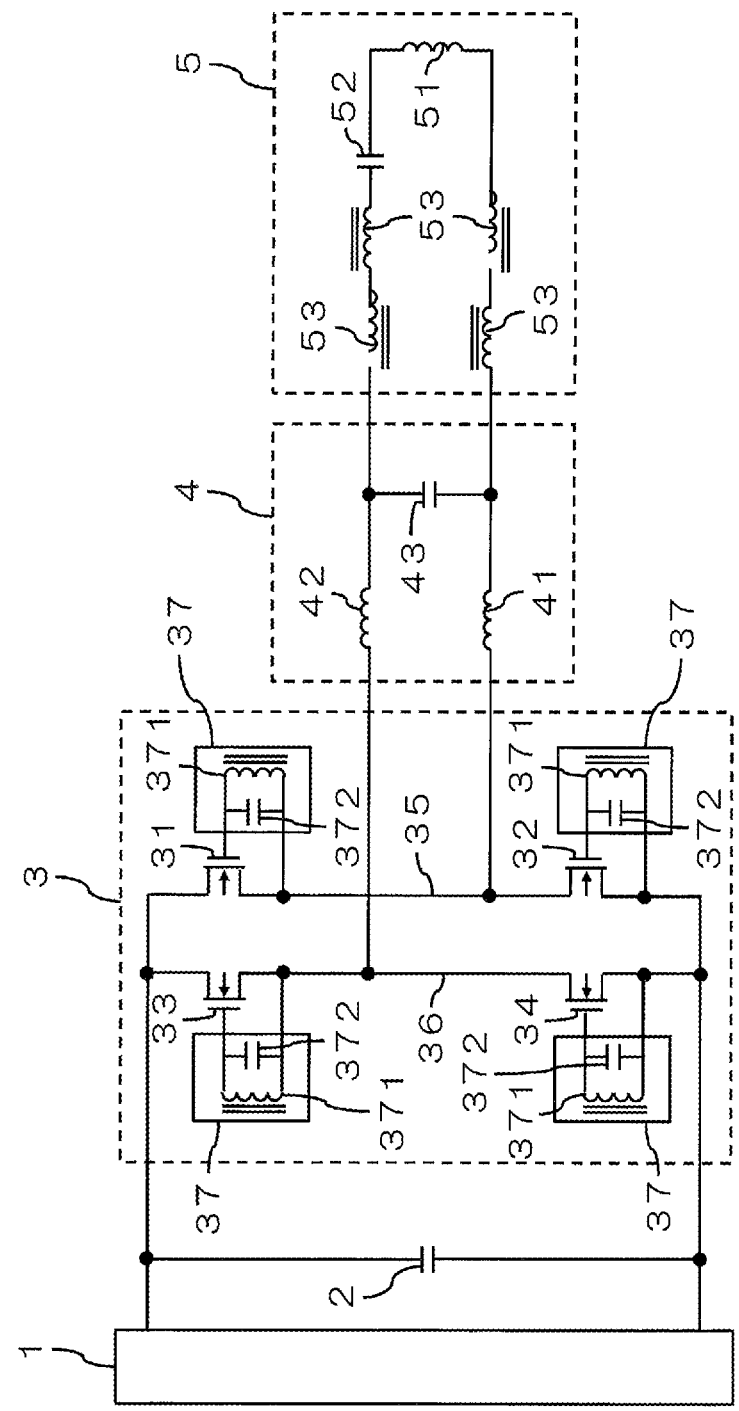
FIG. 1 is a circuit diagram showing a configuration example of a high-frequency power supply device according to an embodiment of the present invention.

FIG. 1 is a circuit diagram showing a configuration example of a high-frequency power supply device according to an embodiment of the present invention. This high-frequency power supply device may be applied to an analysis device such as an inductively coupled plasma (ICP) emission spectrometer, and is a high-frequency power supply device of a self-oscillating method provided with a DC power supply 1, a bypass capacitor 2, a switching circuit 3, an impedance conversion circuit 4, an LC resonant circuit 5, and the like.

The DC power supply 1 sets a DC voltage of the switching circuit 3, and determines the high-frequency power to be supplied to the LC resonant circuit 5. The bypass capacitor 2 is arranged between the DC power supply 1 and the switching circuit 3, and secures a low-impedance high-frequency current path.

The LC resonant circuit 5 includes an induction coil 51, and a capacitor 52 that is connected to the induction coil 51. In this example, a series resonant circuit is configured by the capacitor 52 being connected in series to the induction coil 51. The induction coil 51 included in the LC resonant circuit 5 is for plasma generation, and plasma may be generated at a plasma torch (not shown) by supplying high-frequency power to the induction coil 51 from the DC power supply 1 via the switching circuit 3.

The impedance conversion circuit 4 includes two coils 41 and 42, and a capacitor 43 connected in series between these coils 41 and 42. A loop including the coils 41 and 42 and the capacitor 43 of the impedance conversion circuit 4 is formed between the switching circuit 3 and the impedance conversion circuit 4. Also, a loop including the capacitor 43 of the impedance conversion circuit 4, and the induction coil 51 and the capacitor 52 of the LC resonant circuit 5 is formed between the impedance conversion circuit 4 and the LC resonant circuit 5.

The switching circuit 3 is a configuration including a semiconductor device, and is connected to the DC power supply 1 via the semiconductor device. In this example, the switching circuit 3 is configured from a bridge circuit including four MOSFETs (Metal Oxide Semiconductor Field-Effect Transistor) 31, 32, 33 and 34. The switching circuit 3 is configured from a bridge circuit of a half-bridge configuration or a full-bridge configuration. Additionally, the semiconductor device to be included in the switching circuit 3 is not limited to the MOSFET. Also, the switching circuit 3 is not limited to the half-bridge configuration or the full-bridge configuration.

The DC power supply 1 and the bypass capacitor 2 are connected between the drain electrode of the MOSFET 31 and the source electrode of the MOSFET 32. Also, the source electrode of the MOSFET 31 and the drain electrode of the MOSFET 32 are connected by a wire 35, and the coil 41 of the impedance conversion circuit 4 is connected the wire 35.

The DC power supply 1 and the bypass capacitor 2 are connected between the drain electrode of the MOSFET 33 and the source electrode of the MOSFET 34. Also, the source electrode of the MOSFET 33 and the drain electrode of the MOSFET 34 are connected by a wire 36, and the coil 42 of the impedance conversion circuit 4 is connected the wire 36.

A gate drive circuit 37 is connected to the gate electrode of each of the MOSFETs 31, 32, 33 and 34. At the time of oscillation of the LC resonant circuit 5, each of the MOSFETs 31, 32, 33 and 34 is to be switched to on state or off state at a predetermined timing via the gate drive circuit 37. DC power supplied from the DC power supply 1 may thus be switched, and be provided to the LC resonant circuit 5.

A coil 371 and a capacitor 372 that are connected in parallel with each other are provided to each gate drive circuit 37. The coil 371 provided to each gate drive circuit 37 configures a secondary coil of a transformer, and is connected to the control terminals (the gate electrode and the source electrode) of the corresponding MOSFET 31, 32, 33 or 34 to turn on or off the MOSFET 31, 32, 33 or 34. A primary coil of each transformer is configured from the coil 53 included in the LC resonant circuit 5. Each coil 53 is connected in series to the induction coil 51 and the capacitor 52. In this manner, in the present embodiment, a transformer configured from a pair of the primary coil 53 and the secondary coil 371 is provided in association with the corresponding MOSFET 31, 32, 33 or 34, and a feedback voltage may be supplied to the MOSFET 31, 32, 33 or 34.

Figure 2:
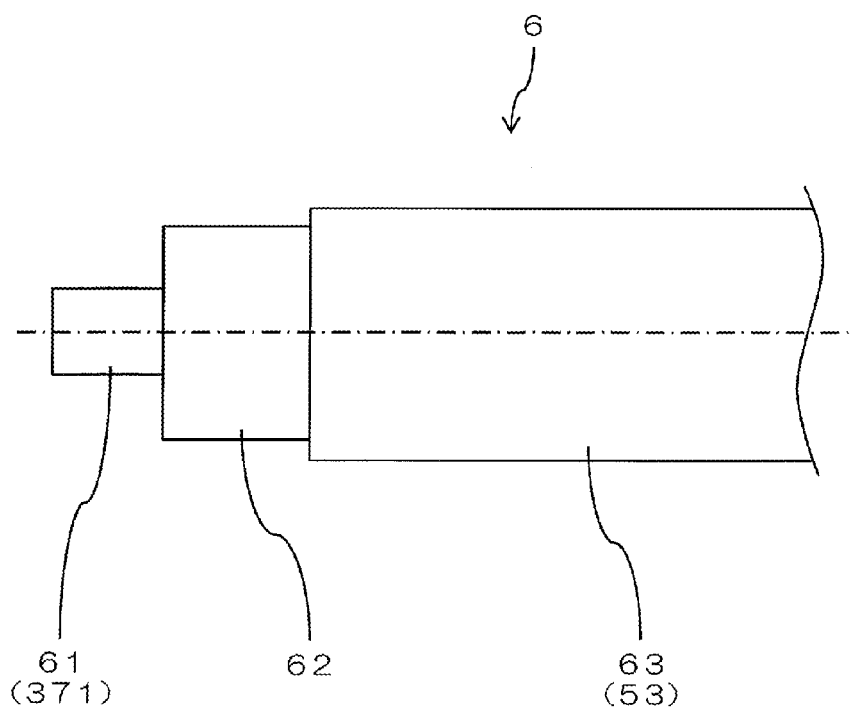
FIG. 2 is a schematic diagram for describing an internal configuration of a transformer.

FIG. 2 is a schematic diagram for describing an internal configuration of the transformer 6. The transformer 6 is configured from a coil (primary coil) 53 provided to the LC resonant circuit 5, and a coil (secondary coil) 371 provided to the gate drive circuit 37.

In the present embodiment, the transformer 6 is formed by a semi-rigid co-axial cable. A semi-rigid co-axial cable includes, on the same axis, a linear center conductor 61, a tubular insulator 62 covering the outside of the center conductor 61, and a tubular outer conductor 63 covering the outside of the insulator 62. The primary coil 53 of the transformer 6 is configured from the outer conductor 63, and the secondary coil 371 is configured from the center conductor 61.

In this manner, the transformer 6 has a co-axial structure where the primary coil 53 and the secondary coil 371 are on the same axis, and even if the transformer 6 is curved or bent, the state where the primary coil 53 and the secondary coil 371 are arranged in parallel with each other is maintained. Alternatively, the primary coil 53 of the transformer 6 may be configured from the center conductor 61, and the secondary coil 371 may be configured from the outer conductor 63.

Figure 3:
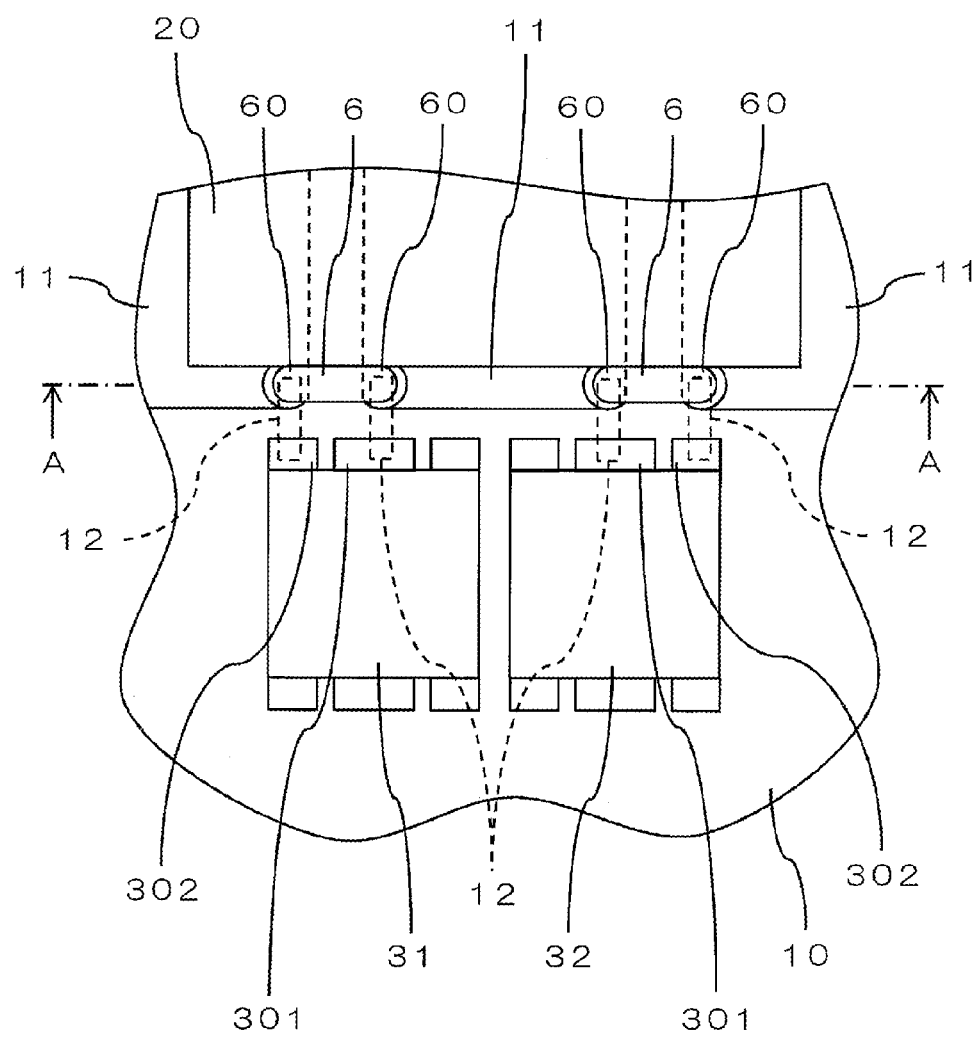
FIG. 3 is a partial plan view showing example configurations of and around MOSFETs.
Figure 4:
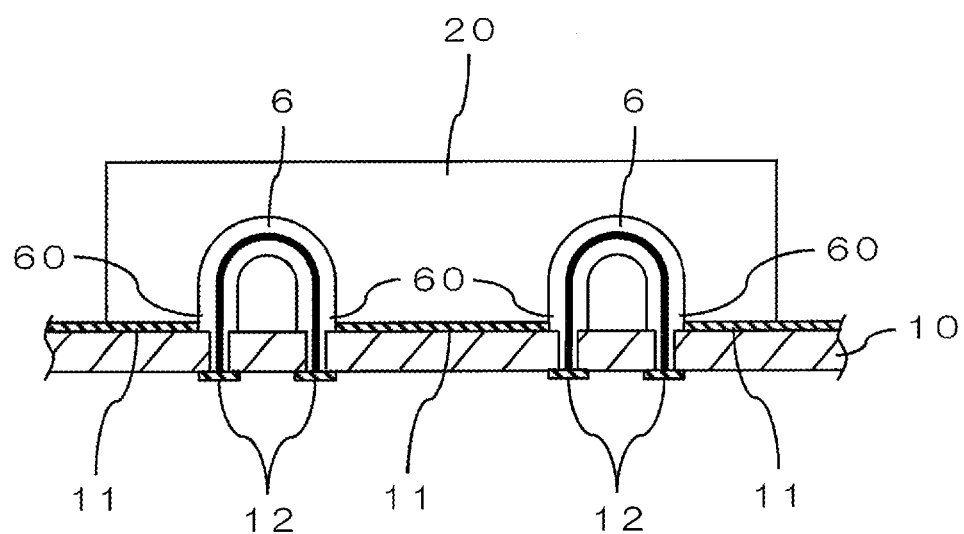
FIG. 4 is a cross-sectional view showing the cross-section along the line A-A in FIG. 3.

FIG. 3 is a partial plan view showing example configurations of and around the MOSFETs 31 and 32. Furthermore, FIG. 4 is a cross-sectional view showing the cross-section along the line A-A in FIG. 3. Although only the configurations of and around the MOSFETs 31 and 32 are shown in FIGS. 3 and 4, the same configurations may be adopted for and around the other MOSFETs 33 and 34.

In the present embodiment, each of the circuits, the switching circuit 3, the impedance conversion circuit 4, and the LC resonant circuit 5 are mounted on a substrate 10. Parts included in each circuit are electrically connected to one another by pattern wiring 11. Since the current that flows to the induction coil 51 for plasma generation is extremely large, if the width of the pattern wiring 11 is narrow, heat generation becomes too great to bear. Accordingly, the pattern wiring 11 desirably adopts a wide pattern. Additionally, the number of substrates 10 may be one, or the substrate 10 may be divided into two or more pieces.

Each transformer 6 is formed into a substantially U shape. A substantially U shape is a curved or bent shape where both end portions 60 of the transformer 6 are close to each other, and is not limited to a U shape, and is a concept including other shapes such as a C shape and a semicircle. The transformer 6 configured by a semi-rigid co-axial cable does not include an outer sheath on the outside of the outer conductor 63, and the outer conductor 63 is exposed, and the primary coil 53 of each transformer 6 is connected to the pattern wiring 11. On the other hand, an input terminal (IN) and an output terminal (OUT) of the secondary coil 371 of each transformer 6 are electrically connected to the control terminals (a gate electrode 301, a source electrode 302) of one of the MOSFETs 31, 32, 33 and 34 by pattern wiring 12, on the opposite side of the substrate 10 from the pattern wiring 11.

An insulating radiator 20 is in contact with each transformer 6. In this case, one radiator 20 may be in contact with the transformers 6 provided for the MOSFETs 31, 32, 33 and 34, or different radiators 20 may be in contact with respective transformers 6. The radiator 20 is configured from an aluminum nitride block, for example. However, the radiator 20 may be formed of a material other than aluminum nitride as long as it is an insulating material of high thermal conductivity.

In the case where the transformer 6 is configured from a co-axial cable, the outer surface of the transformer 6 is a circumferential surface, and thus if the contact surface of the radiator 20 with the transformer 6 is a flat surface, the radiator 20 contacts only a small portion of the co-axial cable, and heat dissipation is not sufficient. Accordingly, it is desirable to increase the contact area of the radiator 20 and the transformer 6 by coating the periphery of the contact portion of the transformer 6 and the radiator 20 with thermal grease, for example, or by making the contact surface of the radiator 20 to the transformer 6 have a concave surface corresponding to the outer surface of the transformer 6.

In the present embodiment, by forming each transformer 6 into a substantially U shape, a length long enough to generate a sufficient feedback voltage may be secured, and also the length of the pattern wiring 12 between the input terminal (IN) and the output terminal (OUT) of the secondary coil 371 of each transformer 6 and the control terminals (the gate electrode 301, the source electrode 302) of each of the MOSFETs 31, 32, 33 and 34 may be reduced and attenuation of the feedback voltage by pattern inductance may be suppressed. Also, by arranging the primary coil 53 and the secondary coil 371 of each transformer 6 in parallel with each other, the coupling coefficient between the primary coil 53 and the secondary coil 371 is increased.

The feedback voltage may be made large by these structural refinements, and thus there is no need to supply a DC bias voltage to the control terminals of the MOSFETs 31, 32, 33 and 34. That is, in the case where the semiconductor devices of the switching circuit 3 are configured from the MOSFETs 31, 32, 33 and 34, as in the present embodiment, the gate amplitude of the MOSFETs 31, 32, 33 and 34 may be made great, and there is no need to supply a DC bias voltage to the gate electrodes of the MOSFETs 31, 32, 33 and 34.

Moreover, as shown in FIG. 1, by connecting the capacitors 372 in parallel with the secondary coils 371 to the control terminals of corresponding MOSFETs 31, 32, 33 and 34, the influence of variation or fluctuation of the gate-source capacitance of the MOSFETs 31, 32, 33 and 34 may be made small. Also, since the voltage at the control terminals of the MOSFETs 31, 32, 33 and 34 having a non-linear gate charge characteristic is made to change more linearly, ringing in the switching waveform due to load inductance is suppressed, high power supply efficiency may be realized.

Particularly, in the present embodiment, the coupling coefficient between the primary coil 53 and the secondary coil 371 maybe increased by arranging the two on the same axis. Also, by configuring each transformer 6 by using a semi-rigid co-axial cable not including an outer sheath, high heat dissipation efficiency may be realized without a task of removing the outer sheath.

Furthermore, since heat generated at each transformer 6 is dissipated via the radiator 20, the heat dissipation efficiency may be further increased. Especially, by using the insulating radiator 20, even if each transformer 6 does not include an outer sheath the feedback voltage may be prevented from being reduced due to the current of the primary coil flowing to the radiator 20 and the interlinkage magnetic flux to the secondary coil being reduced.

Figure 5:
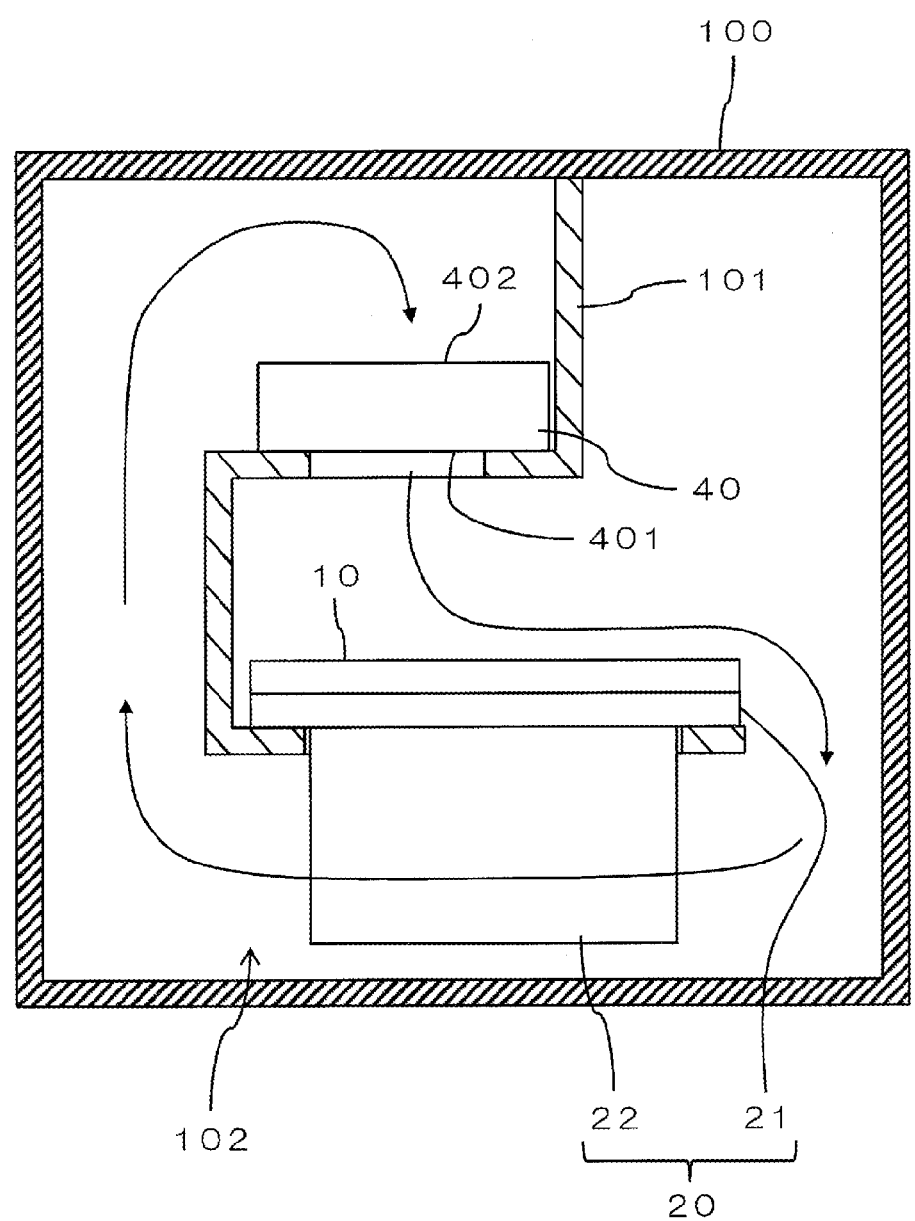
FIG. 5 is a schematic cross-sectional view showing the entire configuration of the high-frequency power supply device in FIG. 1.

FIG. 5 is a schematic cross-sectional view showing the entire configuration of the high-frequency power supply device in FIG. 1. This high-frequency power supply device is configured to include various parts inside a hollow housing 100. The housing 100 has an insertion hole or the like for inserting a cable, but other than that, no opening is formed, and the housing 100 is almost completely hermetically sealed. That is, an air inlet port for taking air into the housing 100, an outlet port for exhausting air inside the housing 100, and the like are not formed to the housing 100.

The space inside the housing 100 is partitioned by one or a plurality of partition walls 101. The substrate 10 on which circuits such as the switching circuit 3, the impedance conversion circuit 4, the LC resonant circuit 5 and the like are mounted is held by the partition wall 101, for example. Various parts such as the switching circuit 3, the LC resonant circuit 5, the transformer 6 and the like are thus accommodated inside the housing 100.

However, the induction coil 51 included in the LC resonant circuit 5 is not accommodated inside the housing 100, and is arranged inside a plasma stand (not shown). The substrate 10 inside the housing 100 and the induction coil 51 outside the housing 100 are connected by a conductor, such as a copper plate, and the induction coil 51 and the plasma stand is separated by an insulator of fluororesin, for example.

The radiator 20 provided inside the housing 100 is attached to the substrate 10. The radiator 20 adopts a water cooling method, for example, and includes a main body 21 where refrigerant flows, and a plurality of heat sink fins 22 protruding from the main body 21. The radiator 20 mainly cools the MOSFET mounted on the substrate 10. For example, the main body 21 may be made to directly contact the substrate 10 so as to cool the substrate 10 and parts mounted on the substrate 10. However, heat dissipation would be insufficient since it would be through the insulating material of the substrate 10.

Accordingly, a cooling fan 40 is provided inside the housing 100, in addition to the substrate 10 and the radiator 20. The cooling fan 40 is held by the partition wall 101, for example, and faces a surface, of the substrate 10, opposite from the side of the radiator 20. Thus, when the cooling fan 40 is rotated, air inside the housing 100 is blown by the cooling fan 40 against the substrate 10.

The space inside the housing 100 partitioned by the partition wall 101 forms a circulation path 102 for circulating the air inside the housing 100. That is, air that is blown from an air outlet 401 of the cooling fan 40 is exposed to the substrate 10 and the radiator 20 provided halfway along the circulation path 102, and is then taken into the cooling fan 40 through an air inlet 402 and is again blown from the air outlet 401.

The plurality of heat sink fins 22 provided to the radiator 20 are arranged, in parallel with one another while being spaced from one another, in such a way as to extend along the flow direction of the air on the circulation path 102. By the radiator 20 (the heat sink fins 22) being arranged halfway along the circulation path 102 in this manner, the air inside the housing 100 may be made to circulate while being guided to the radiator 20 by the cooling fan 40.

In this manner, in the present embodiment, parts such as the LC resonant circuit 5, not including the induction coil 51, and the switching circuit 3 and the transformer 6 are accommodated inside the housing 100, and by causing the air inside the housing 100 to circulate by the cooling fan 40, air outside the device can be prevented from easily flowing into the device. Thus, pollution of the parts inside the device by the air outside the device may be prevented.

Also, since the parts inside the housing 100 are cooled by the water-cooling radiator 20, and the air that is circulated inside the housing 100 by the cooling fan 40 is circulated while being cooled by the water-cooling radiator 20, high cooling efficiency may be realized. Accordingly, the parts inside the device may be desirably cooled even with a configuration where air outside the device does not easily flow into the device.

In the embodiment described above, a case is described where the LC resonant circuit 5 including the induction coil 51 is configured from a series resonant circuit where the capacitor 52 is connected in series to the induction coil 51. However, such a configuration is not restrictive, and the LC resonant circuit 5 may be configured from a parallel resonant circuit where the capacitor 52 is connected in parallel with the induction coil 51.

The transformer 6 is not limited to be configured by a semi-rigid co-axial cable, and may alternatively be configured from other co-axial cable. In the case of using a co-axial cable with an outer sheath as the transformer 6, the outer sheath is desirably removed before use. Moreover, the configuration where a co-axial cable is used is not restrictive, and configurations are also allowed where the primary coil 53 and the secondary coil 371 of the transformer 6 are arranged on the same axis, and where these are simply arranged in parallel without being on the same axis.

The high-frequency power supply device according to the present invention may also be applied to other analysis devices that perform analysis by using plasma, in addition to the ICP emission spectrometer. Moreover, the high-frequency power supply device according to the present invention may also be applied to various other devices that use plasma (for example, a high-frequency oscillation circuit for plasma CVD or the like), without being limited to analysis devices.

What is claimed is:

1. A high-frequency power supply device of a self-oscillating method, the device comprising:
   a DC power supply;
   an LC resonant circuit including an induction coil for plasma generation, and a capacitor;
   a switching circuit including a semiconductor device that switches DC power supplied from the DC power supply, and provides high-frequency power to the LC resonant circuit; and
   a transformer including a primary coil that is included in the LC resonant circuit, and a secondary coil that is connected to a control terminal of the semiconductor device to turn on or off the semiconductor device,
   wherein the transformer is formed into a substantially U shape,
   wherein the primary coil and the secondary coil of the transformer are arranged in parallel, and
   wherein a capacitor is connected to the control terminal of the semiconductor device, in parallel with the secondary coil.

2. The high-frequency power supply device according to claim 1, wherein the transformer is formed into a co-axial structure including the primary coil and the secondary coil on a same axis.

3. The high-frequency power supply device according to claim 2, wherein the transformer is configured by a semi-rigid co-axial cable.

4. The high-frequency power supply device according to claim 1, wherein the transformer is in contact with an insulating radiator.

5. The high-frequency power supply device according to claim 1, wherein the semiconductor device is a MOSFET.

6. A high-frequency power supply device of a self-oscillating method, the device comprising:
   a DC power supply;
   an LC resonant circuit including an induction coil for plasma generation, and a capacitor;
   a switching circuit including a semiconductor device that switches DC power supplied from the DC power supply, and provides high-frequency power to the LC resonant circuit;
   a transformer including a primary coil that is included in the LC resonant circuit, and a secondary coil that is connected to a control terminal of the semiconductor device to turn on or off the semiconductor device;
   a housing configured to accommodate the LC resonant circuit, not including the induction coil, and the switching circuit and the transformer;
   a water-cooling radiator, provided inside the housing, configured to cool parts inside the housing; and
   a cooling fan, provided inside the housing, configured to cause air inside the housing to circulate while guiding the air to the radiator.

\* \* \* \* \*